(12) United States Patent
Shea et al.

(10) Patent No.: US 8,409,950 B1
(45) Date of Patent: Apr. 2, 2013

(54) METHOD FOR INTEGRATING SONOS NON-VOLATILE MEMORY INTO A SUB-90 NM STANDARD CMOS FOUNDRY PROCESS FLOW

(75) Inventors: Patrick Bruckner Shea, Washington, DC (US); Dennis Adams, Gambrills, MD (US); Michael Rennie, Mechanicsville, VA (US); Joseph Terence Smith, Columbia, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 106 days.

(21) Appl. No.: 13/100,986

(22) Filed: May 4, 2011

Related U.S. Application Data

(63) Continuation-in-part of application No. 12/941,645, filed on Nov. 8, 2010, now Pat. No. 8,258,027.

(51) Int. Cl.
*H01L 21/336* (2006.01)
(52) U.S. Cl. .. 438/257; 438/200; 438/258; 257/E21.679
(58) Field of Classification Search ............ 257/E21.679
See application file for complete search history.

(56) References Cited

U.S. PATENT DOCUMENTS

2008/0293207 A1* 11/2008 Koutny et al. ................ 438/306

* cited by examiner

*Primary Examiner* — Daniel Whalen
(74) *Attorney, Agent, or Firm* — Andrews Kurth LLP

(57) ABSTRACT

An embodiment of a method is disclosed to integrate silicon oxide nitride oxide silicon (SONOS) non-volatile memory (NVM) into a standard sub-90 nm complementary metal oxide semiconductor (CMOS) semiconductor foundry process flow. An embodiment of the method adds a few additional steps to a standard CMOS foundry process flow and makes minor changes to the rest of the baseline CMOS foundry process flow to form a new process module that includes both CMOS devices and an embedded SONOS NVM. An embodiment of the method utilizes new material sets (which are not utilized at larger nodes) that enhance NVM performance by improving charge tunneling behavior and reducing leakage currents. Furthermore, an embodiment of the method integrates CMOS with SONOS NVM at ever-shrinking dimensions while enhancing the NVM performance, without performing extra, costly processing steps.

18 Claims, 6 Drawing Sheets

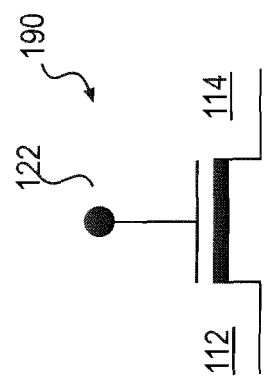
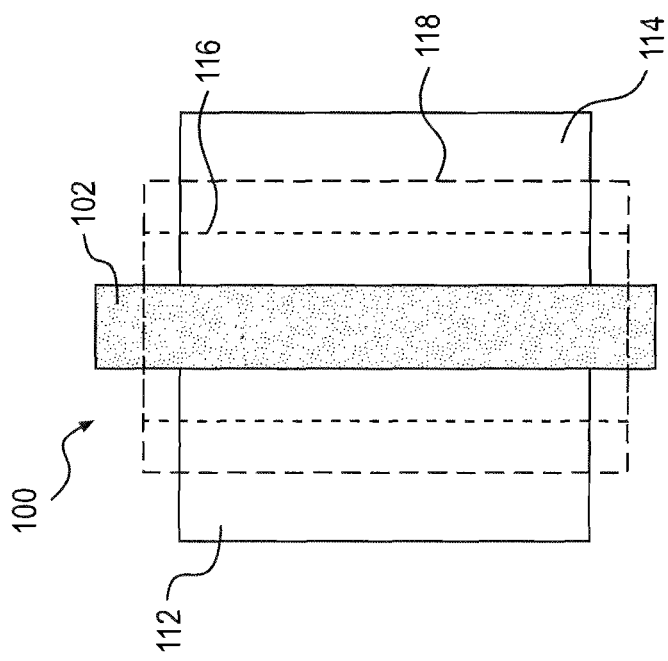
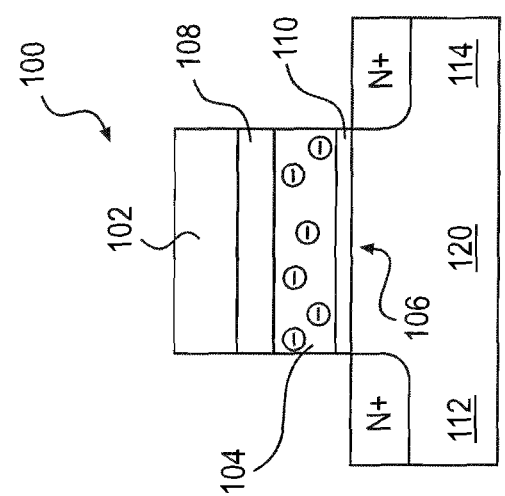

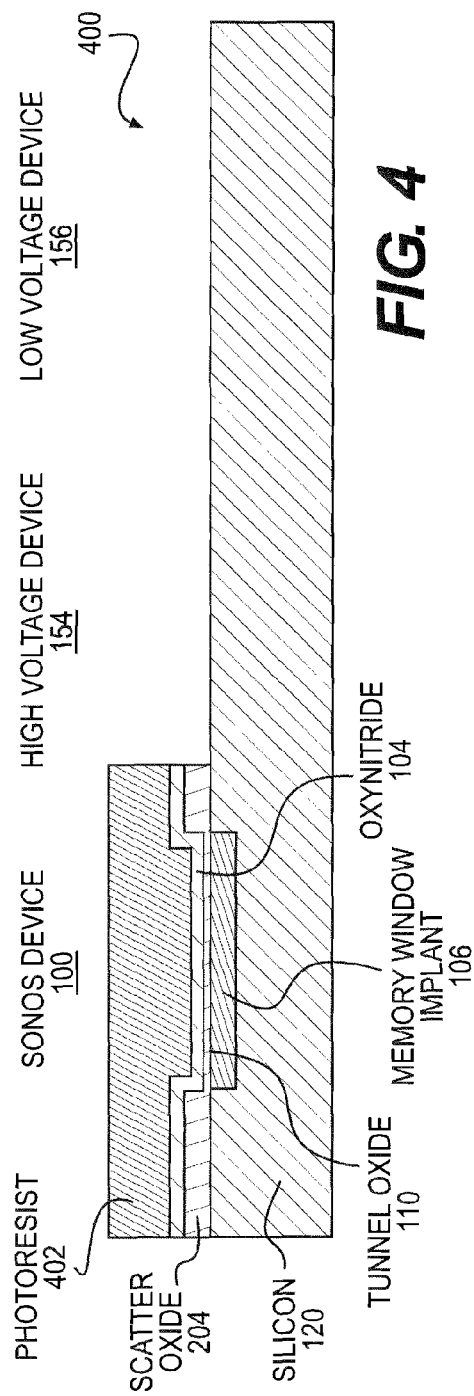
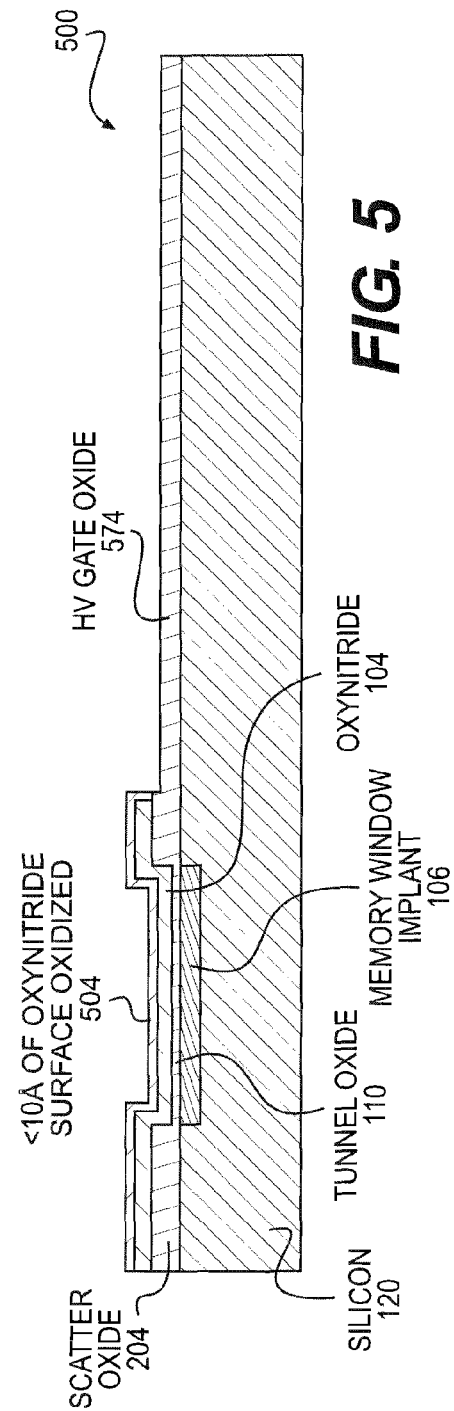

METHOD FOR INTEGRATING SONOS NON-VOLATILE MEMORY INTO A SUB-90 NM STANDARD CMOS FOUNDRY PROCESS FLOW

RELATED APPLICATION

This application is a continuation-in-part application of U.S. Provisional application Ser. No. 12/941,645, entitled "METHOD FOR INTEGRATING SONOS NON-VOLATILE MEMORY INTO A STANDARD CMOS FOUNDRY PROCESS FLOW" and filed Nov. 8, 2010, which is hereby incorporated by reference in its entirety.

BACKGROUND

The fabrication of non-volatile memory (NVM) devices may be integrated into a complementary metal oxide semiconductor (CMOS) foundry process flow. The current state of the art integrates the more complicated floating gate NVM foundry process into foundry process flow for technologies such as field-programmable gate arrays (FPGAs). Recent interest and trends redirect interest towards silicon oxide nitride oxide silicon (SONOS) NVM because of its limited additional process burden and the ability to program (and erase) SONOS NVM at lower voltages.

Examples of embedding SONOS NVM into a CMOS foundry process flow are described in, for example, U.S. Pat. No. 6,946,349, entitled "Method for Integrating a SONOS Gate Oxide Transistor into a Logic/Analog Integrated Circuit Having Several Gate Oxide Thicknesses" (the '349 patent) and U.S. Pat. No. 7,361,560, entitled "Method of Manufacturing a Dielectric Layer in a Memory Device that Includes Nitriding Step" (the '560 patent). However, these patents merely describe the basic concept of embedding SONOS without showing how SONOS NVMs are embedded into a standard CMOS foundry process with the least amount of processing overhead or burden on the standard CMOS foundry process. None of the methods described in these patents or elsewhere teach how to minimize process overhead or burden on standard CMOS foundry process.

Furthermore, as CMOS geometries are aggressively driven to smaller dimensions, the circuit design or process integration aspects of embedding NVM become significantly more difficult. For example, a standard SONOS NVM cell writes at a programming voltage of less than 7V, whereas the CMOS might operate at 1.8V or less. Consequently, circuit designs become more complex, and the integration of the different transistor designs during fabrication becomes more difficult and lengthy. One option is to reduce the programming voltage of SONOS NVM by making the memory stack thinner. However, this option sacrifices charge retention because the charge can more easily exit the thin memory stack. Leakage also increases, making the circuits more power hungry. Thus, what is needed is a SONOS NVM product that combines reasonable programming voltages, excellent retention, and ease of process integration.

DESCRIPTION OF THE DRAWINGS

The detailed description will refer to the following drawings, wherein like numerals refer to like elements, and wherein:

FIGS. 1A-1C illustrate an embodiment of a silicon oxide nitride oxide silicon (SONOS) non-volatile memory (NVM) semiconductor device structure or stack that may be integrated into a standard complementary metal oxide semiconductor (CMOS) foundry process flow;

FIGS. 2-7 illustrate an embodiment of a method to fabricate a sub-90 nm CMOS silicon wafer with an embedded SONOS NVM.

DETAILED DESCRIPTION

Figure 1D:
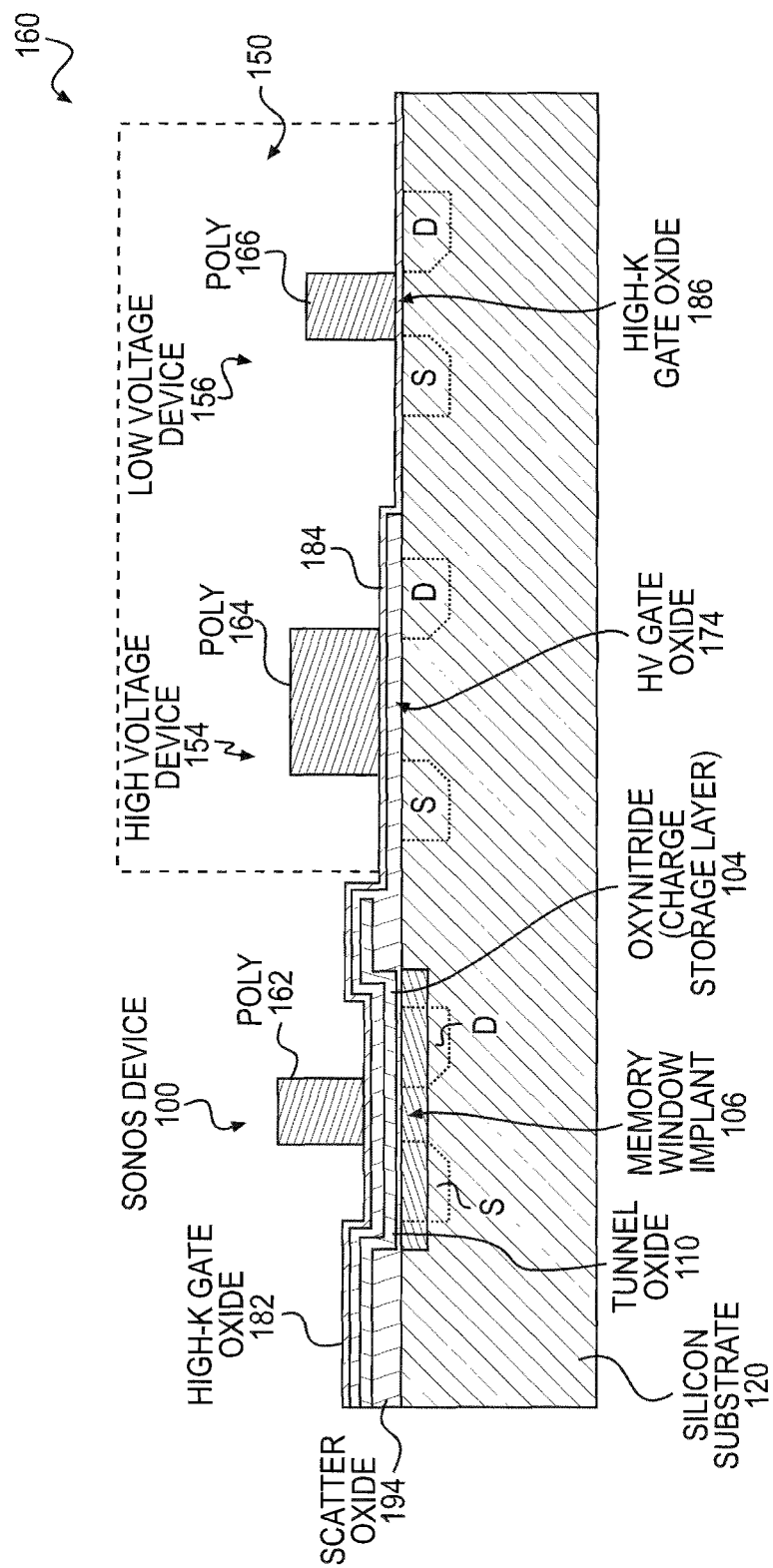
FIG. 1D shows the SONOS NVM of FIGS. 1A-1C coexisting on the same semiconductor substrate with a standard sub-90 nm CMOS device.

Non-volatile memory (NVM) stores a bit of information in an on-chip semiconductor memory cell and preserves the memory state whenever power is removed from the memory cell. Many electrical, magnetic, and physical methods exist for storing this bit in semiconductor NVM chips. For example, charge storage may be used. Semiconductor NVMs that use charge storage as the memory mechanism typically utilize one of two physical device structures referred to as "floating gate" and silicon oxide nitride oxide silicon (SONOS).

An embodiment of a method integrates SONOS NVMs, and the fabrication of SONOS NVMs, into a standard complementary metal oxide semiconductor (CMOS) semiconductor foundry process flow at a sub-90 nanometers (nm) regime (i.e., 90 nm node or smaller is disclosed). An embodiment of the method adds a few additional steps to a standard CMOS foundry process flow and makes minor changes to the rest of the baseline CMOS foundry process flow to form a new process module that includes both CMOS devices and an embedded SONOS NVM. An embodiment of the method utilizes new material sets (which are not utilized at larger nodes) that enhance NVM performance by improving charge tunneling behavior and reducing leakage currents. Furthermore, an embodiment of the method integrates CMOS with SONOS NVM at ever-shrinking dimensions while enhancing NVM performance, without performing extra, costly processing steps.

FIGS. 1A-1C illustrate an embodiment of an embedded SONOS NVM semiconductor device structure or stack 100 (also referred to as embedded SONOS NVM 100) that may be integrated into a standard CMOS foundry process flow. Specifically, FIG. 1A shows an embedded SONOS NVM 100 cross-section, FIG. 1B shows a top view of the embedded SONOS NVM 100, and FIG. 1C shows an embodiment of an embedded SONOS NVM transistor 190 that includes a gate electrode 122, a source electrode 112, and a drain electrode 114.

Referring to FIG. 1, the embedded SONOS NVM 100 includes a gate polysilicon layer 102 (also referred to as gate poly layer), a capping oxide layer 108, an oxynitride (or nitride) charge storage layer 104 (also referred to as oxynitride (or nitride) layer or charge storage layer), and a tunnel oxide layer 110. The capping oxide layer 108 is located on top of the oxynitride layer charge storage layer 104. Similar to a conventional metal oxide semiconductor (MOS) device, doped N+ regions are used to form the source electrode 112 and drain electrode 114, and underneath the tunnel oxide is the doped (silicon) channel region 120. A memory window implant layer 106 is located below the tunnel oxide layer 110.

Many floating gate devices store charges within a conductive polysilicon film in a gate dielectric while a SONOS device stores charges within the oxynitride charge storage layer 104 in the gate dielectric. Threshold voltages of SONOS devices are modulated by the presence of positive or negative charge within this charge storage layer 104. Low and high threshold voltage states may be assigned logic values in order to store a bit of data in the memory cell (e.g., the high threshold voltage is often referenced as a logic one while the low threshold voltage is the logic zero).

The SONOS memory cell (e.g., bit) may be programmed by applying a large positive voltage to the gate electrode 122 (shown in FIG. 1C). This causes electrons (i.e., negative charges) to quantum mechanically tunnel through the tunnel oxide layer 110, which is typically 18 to 20 Angstroms (Å) thick. The electrons are then trapped in the oxynitride charge storage layer 104, which shifts the threshold voltage of the SONOS device positively. The capping oxide layer 108 functions as an insulator to prevent charge injection from the conductive gate polysilicon layer 102 to the oxynitride charge storage layer 104.

SONOS has an inherent advantage over floating gate NVM for embedded NVM because, as detailed below, adding SONOS NVM 100 to a standard CMOS process flow only needs, for example, two additional masking steps and the deposition of an oxide-nitride-oxide (ONO) charge storage layer, shown in FIG. 1A as the tunnel oxide layer 110, the oxynitride layer 104, and the capping oxide layer 108 (collectively referred to as a SONOS stack). The more complex embedded floating gate NVMs need up to four separate gate oxides, a double polysilicon process, deposition of a similar ONO layer, plus up to four additional masking layers.

FIG. 1D shows the embedded SONOS NVM 100 co-existing on the same semiconductor substrate 160 with a standard sub-90 nm CMOS device 150, including, for example, a high voltage CMOS device 154 (also referred to as high voltage device), that programs the embedded SONOS NVM 100, as well as a standard low voltage CMOS device 156 (also referred to as low voltage device). A nonvolatile memory chip process typically needs different sets of transistors utilizing different operating voltages to be fabricated on the same chip. Specifically, there is typically a group of low voltage transistors operating in the range of 1-1.8V, for example, that are used for reading circuitry and other peripheral circuitry. There is also a set of transistors that need to operate at higher voltages, such as from 5V to 18V. These transistors are typically the memory devices that need a high voltage to be written.

The embedded SONOS NVM 100 includes a silicon substrate 120, a memory window implant layer 106 in the Source-Drain region, an oxynitride charge storage layer 104, a scatter oxide layer 194, a high permittivity (also referred to as high dielectric constant, or high-k) gate oxide layer 182 (serving as the capping oxide layer 108 of FIG. 1A), and a gate polysilicon layer 162. The high voltage device 154 includes a high voltage gate oxide layer 174 and a high-k gate oxide layer 184 above the Source-Drain region, and a gate polysilicon layer 164. The low voltage device 156 includes a high-k gate oxide layer 186 and a gate polysilicon layer 166.

As noted above, it is important to minimize the number of additional process steps needed to build the SONOS structure. Therefore, it is preferable to share as many process steps in the standard CMOS foundry process flow and only add a few extra steps, while minimizing any additional changes that need to be made to the rest of the process flow to accommodate the SONOS process module.

An embodiment of a method for integrating SONOS NVM into a standard CMOS foundry process flow adds, for example, two extra masking (i.e., photolithographic) steps to a typical CMOS foundry process flow, which typically includes twenty or more masking steps. The two extra masking steps are, for example, a memory window implant masking step and a stack removal masking step.

With reference to FIG. 1B, a simplified physical layout illustrates the placement of a memory window implant mask 116 and a stack removal mask 118 (also referred to as stack removal photoresist mask) that are used in these two masking steps. The purpose of the memory window implant masking step is to selectively set the threshold voltage of the SONOS transistor (using a separate ion implant step). The stack removal masking step uses a stack removal photoresist layer (see 402 in FIG. 4) defined by the stack removal mask 118 to allow the tunnel oxide layer 110, the oxynitride layer 104, and the capping oxide layer 108 (collectively referred to as a SONOS stack) to be selectively removed from all regions of the silicon wafer, except for the SONOS memory cell regions.

FIGS. 2-7 illustrate steps of an embodiment of a method to fabricate a sub-90 nm CMOS silicon wafer with an embedded SONOS NVM (also referred to as a SONOS process module sequence).

Figure 2:
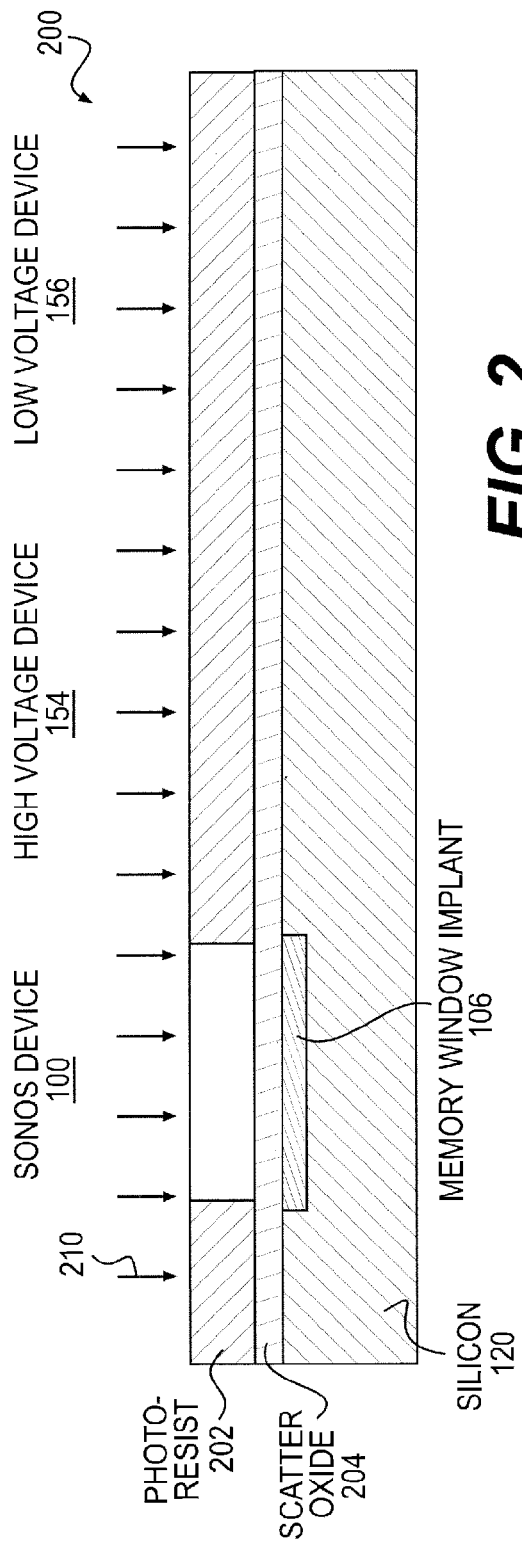

With reference to FIG. 2, in an embodiment, a first step 200 of the SONOS process module sequence is illustrated. The step 200 may take place immediately after threshold voltage adjustment implants in the overall baseline CMOS foundry process flow. In step 200, the memory window implant layer 106 may be patterned using memory window implant photoresist 202, which defines a memory window opening. The memory window implant layer 106 may be defined by the memory window implant mask (see 116 in FIG. 1B). The patterning of memory window implant layer 106 may form patterned SONOS memory cell regions. Next, ions may be implanted through a scatter oxide layer 204 (arrows 210) to set the threshold voltage. Specifically, after the photoresist 202 is patterned by photolithography to open the memory window region, the memory window ion implantation is performed.

Figure 3:
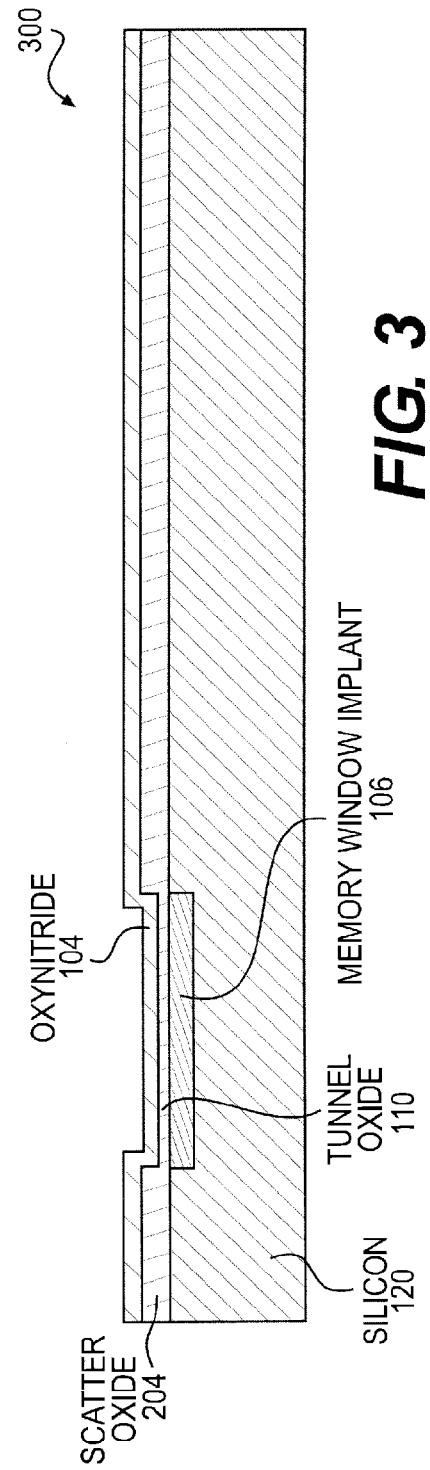

With reference to FIG. 3, step 300 of the SONOS process module sequence is illustrated. After the memory window ion implantation, the photoresist 202 (not shown in FIG. 3) is left on the wafers (which include the scatter oxide layer 204, the memory window implant layer 106, and the doped silicon channel region 120). In step 300, while the photoresist 202 remains on the wafers, the wafers may be wet etched (i.e., stripped) to remove the scatter oxide layer 204 in the memory window opening, so that the oxide is everywhere but in the memory window opening.

Next, the memory window implant photoresist 202 may be removed. The doped silicon channel region 120 are unaffected, except where it overlaps with the memory window implant layer 106 where the memory window implant layer 106 takes precedence. Next, a tunnel oxide layer 110 of, for example, 18 Å, may be grown, and an oxynitride layer 104 of, for example, 120 Å may be deposited. One skilled in the art will appreciate that other thicknesses of the tunnel oxide layer 110 and oxynitride layer 104 may also be applied.

At this stage, smaller nodes of CMOS and SONOS, such as those that are 90 nm or smaller, begin to vary from larger nodes. To reduce the operating voltages of CMOS nodes below 130 nm, the CMOS gate oxide and electrode materials may be changed from the standard thermal oxide and doped polysilicon to a high permittivity (also referred to as high dielectric constant, or high-k), deposited oxide with a deposited metal gate electrode, such as hafnium oxide with a tantalum nitride gate electrode. One skilled in the art will appreciate that other types of high permittivity material can be used. This can be accomplished by depositing, instead of thermally growing, the capping oxide layer 108 (shown in FIG. 1A) at the sub 90 nm regime in the embedded SONOS NVM 100 using, for example, atomic layer deposition (ALD). Depositing, instead of growing, the capping oxide layer may eliminate an additional long, high temperature thermal cycle and may reduce the amount of any doping diffusion, especially shallow threshold adjust channel implants, in ultra-small geometry devices. Furthermore, replacing the thermal oxide and doped polysilicon for the capping oxide layer with a material that has a high permittivity may lead to lower (and desirable) SONOS programming and erase voltages. Additionally, the high permittivity material can be deposited thicker than the thermal oxide and doped polysilicon to reduce leakage current.

With reference now to FIG. 4, step 400 of the SONOS process module sequence is illustrated. As shown, the SONOS stack may be patterned using a stack removal photoresist layer 402 defined by the stack removal photoresist mask (see 118 in FIG. 1B). A plasma etch (i.e., dry etch) may be used to remove the oxynitride layer 104 from the entire wafer except over the patterned SONOS memory cell regions. The memory window implant mask 116 may be slightly smaller than the stack removal photoresist mask 118 to allow the stack removal etch to stop on the thick scatter oxide layer 204 to avoid any attack of the silicon active layer.

With the stack removal photoresist layer 402 still on the wafers, the scatter oxide layer 204 over the CMOS gates may be removed using a wet etch.

FIG. 5 shows another step 500 of the SONOS process module sequence for a sub-90 nm regime foundry process flow that includes a thick high voltage gate oxide layer 574 grown on the entire wafer. The stack removal photoresist layer 402 may be stripped as shown in FIG. 5. The thick high voltage gate oxide layer 574 may also form a very thin, such as less than 10 Å, oxidized layer 504 on top of the oxynitride charge storage layer 104. Compared with a conventional CMOS foundry process flow for cleaning silicon wafers immediately prior to gate oxidization, an embodiment of the method for integrating SONOS NVM into a standard CMOS foundry process flow processes the silicon wafers without hydrofluoric acid to ensure that none of the thin capping oxide in the capping oxide layer 108 is removed. This step is called the pre-gate oxide or pre-gate oxidation cleaning step and conventional CMOS foundry processes typically include hydrofluoric acid in this (wet) cleaning step.

Figure 6:
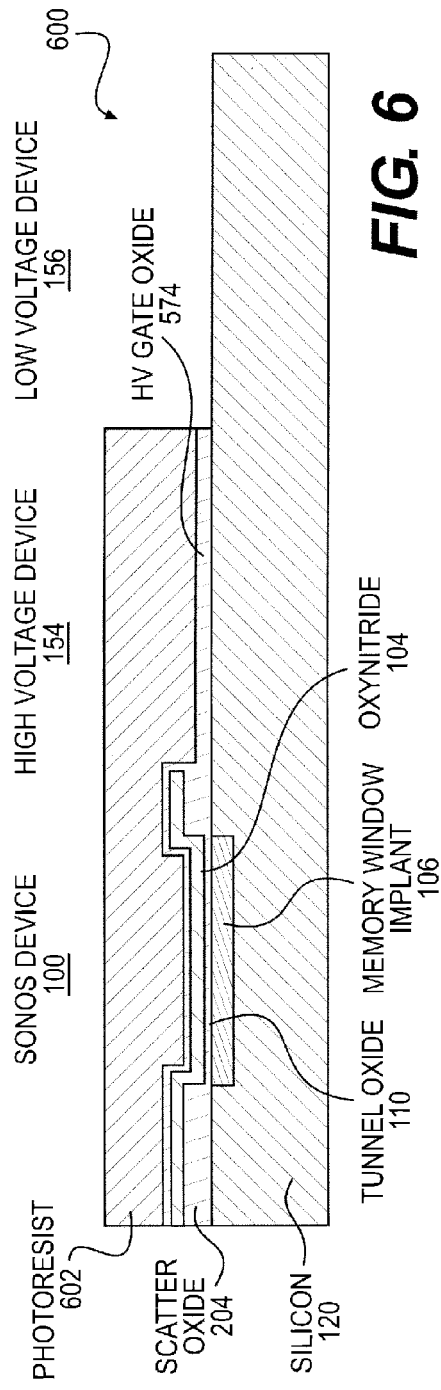

With reference now to FIG. 6, step 600 of the SONOS process module sequence is illustrated. As shown, a photoresist 602 is deposited over the embedded SONOS NVM 100 and the high voltage device 154. The high voltage gate oxide 574 over the high voltage device 154 is patterned using the photoresist 602. The high voltage gate oxide 574 over the low voltage device 156 is stipped. The photoresist 602 is then stripped and the wafers are now ready for the high-k gate oxide deposition process sequence.

Figure 7:
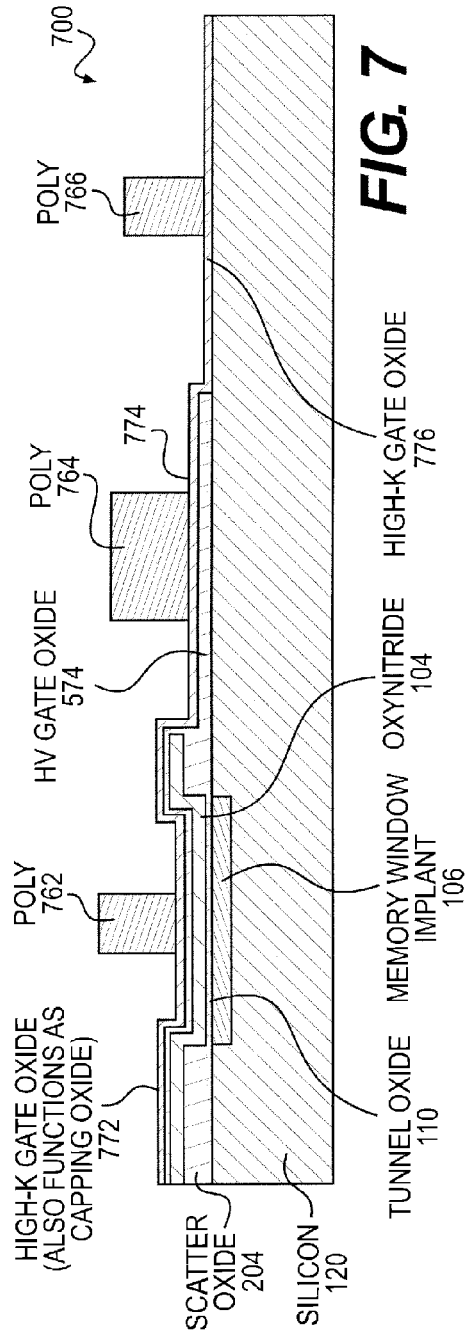

With reference now to FIG. 7, step 700 of the SONOS process module sequence is illustrated. As shown, after the pre-gate oxide cleaning step, a high-k gate oxide layer (shown as 772, 774, 776) is deposited using, for example, ALD. Next, a replacement gate polysilicon layer (shown as 762, 764, 766) may be deposited over the high-k gate oxide layer (shown as 772, 774, 776), patterned, and etched to form the gate electrode 122 (shown in FIG. 1C) for both the SONOS transistors and for the standard CMOS gates. The photoresist 602 is stripped.

As shown in FIG. 7, the high-k gate oxide layer 776 over the low voltage device 156 forms a single dielectric layer, the high-k gate oxide layer 774 over the high voltage device 154 forms a dual dielectric layer with the high-k gate oxide as the top layer. For the embedded SONOS NVM 100, the high-k gate oxide layer 772 forms a capping oxide layer (same as 108 shown in FIG. 1A) between the oxynitride charge storage layer 104 and the gate polysilicon layer 762.

The high-k gate oxide deposition process sequence may be more complicated than what is shown in FIG. 7 with a short (and very thin) thermal oxide step performed first to passivate surface states, followed by the high-k oxide deposition performed using, for example, ALD.

One skilled in the art will appreciate that other variations may apply the SONOS process module sequence. For example, in a 45 nm process flow, the polysilicon gate (762, 764, 766 shown in FIG. 7) may be replaced downstream with a metal gate. The workfunction of the metal gate may be selectively matched to the N+ and P+ polysilicon that is replaced. In larger 65 nm or 90 nm geometries, the polysilicon gate may not be replaced. Also, the 65 nm or 90 nm process flow may not use a high-k gate oxide for the low voltage device 156, and instead may use standard nitrided silicon dioxide (e.g., oxide —SiO2) for the gate oxide. However, a deposited high-k gate oxide layer may still be used as the capping oxide layer 108 (shown in FIG. 1A) for the embedded SONOS NVM 100 to reduce the thermal cycles.

In summary, starting from a standard CMOS foundry process flow, an embodiment of the method for integrating SONOS NVM into a standard CMOS foundry process flow adds only a few steps to form a SONOS NVM device. The SONOS NVM device may share all other front end of the line (FEOL) and back end of the line (BEOL) process steps and device structures, such as wells, isolation, channel implants, poly gate, lightly doped diffusion (LDD), source/drain (S-D), silicide, contact, and interconnect.

Figure 8:
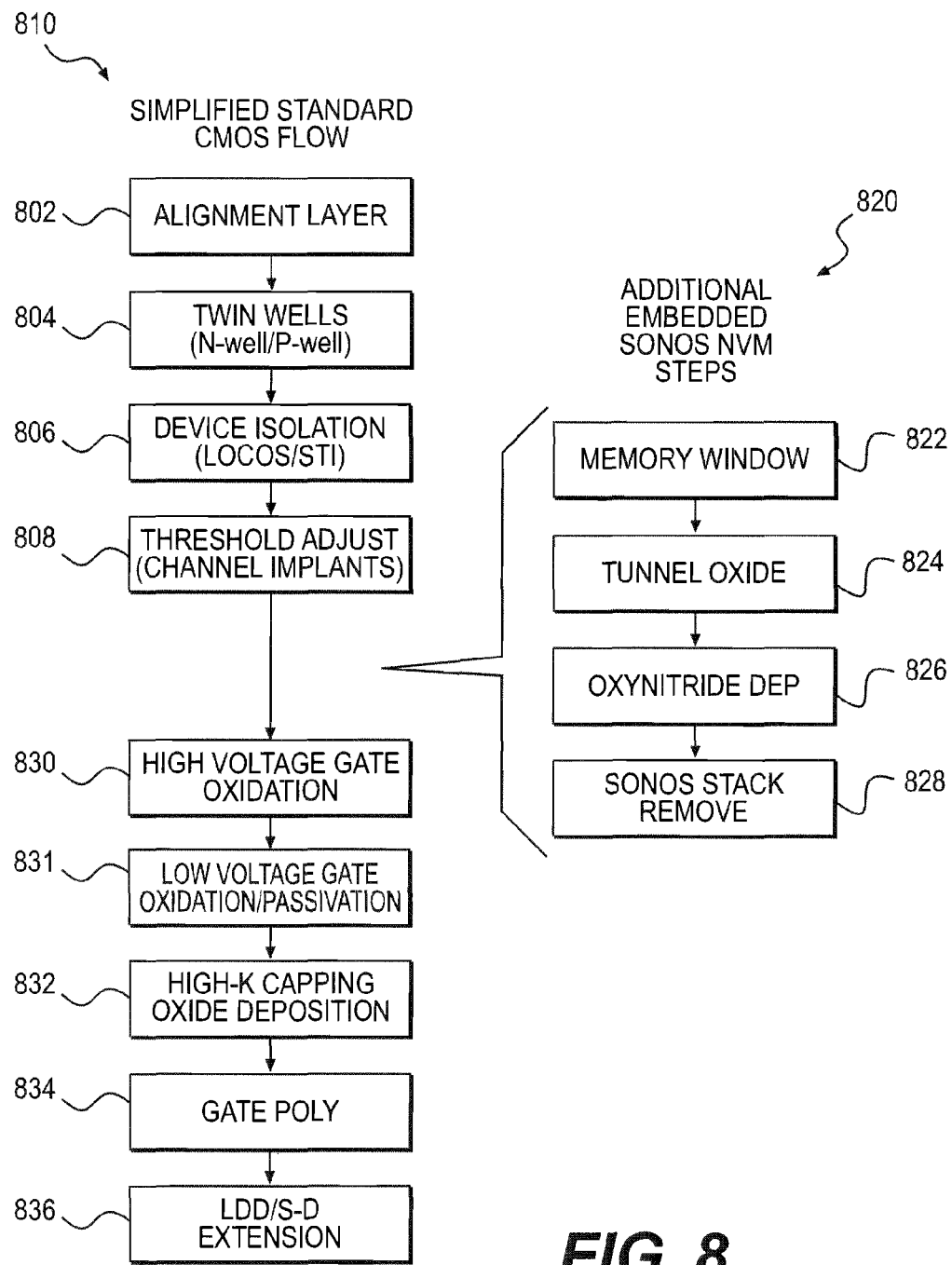
FIG. 8 illustrates an embodiment of a simplified standard CMOS foundry process flow with exemplary additional embedded SONOS NVM steps added.

FIG. 8 is a flowchart illustrating an embodiment of a simplified standard CMOS foundry process flow 810 with exemplary additional embedded SONOS NVM steps 820 added. A simplified standard CMOS foundry process flow 810 includes forming an alignment layer (block 802), forming twin wells (N-well and P-well) (block 804), device isolation (block 806), and performing threshold adjustment (e.g., channel implants) (block 808). Forming an alignment layer 802 patterns alignment marks on the silicon wafers for subsequent photolithography processing. Forming twin well 804 enables complementary NMOS and PMOS devices (CMOS) to be formed on the same silicon substrate in separate doped regions, N-Wells for PMOS and P-Wells for NMOS devices.

Isolating device 806 electrically and physically isolates neighboring MOS devices from each other using silicon dioxide as an insulating material. Adjusting threshold 808 is typically done using ion implantation to control and optimize MOS device parameters such as threshold voltage and off current. After threshold adjustment 808, the additional embedded SONOS NVM steps 820 may be added.

The additional embedded SONOS NVM steps 820 may include patterning a memory window implant layer (block 822), growing a tunnel oxide layer (block 824), depositing an oxynitride layer (block 826), and patterning a stack removal photoresist layer defined by a stack removal mask (block 828). Next, an embodiment of the simplified standard CMOS foundry process flow 810 with additional embedded SONOS NVM steps 820 returns to the standard CMOS flow 810 to grow high voltage gate oxide (block 830) and grow low voltage gate oxide (block 831). Following the high voltage gate oxidation 830 and low voltage gate oxidation/passivation 831, an embodiment of the simplified standard CMOS foundry process flow 810 with additional embedded SONOS NVM steps 820 deposits a high-k gate oxide layer as the capping oxide layer at the sub-90 nm regime (block 832).

Patterning 822 the memory window implant layer may be performed, e.g., as described above with reference to FIG. 2 and step 200 illustrated therein. Growing 824 the tunnel oxide layer may be performed, e.g., as described above with reference to FIG. 3 and step 300 illustrated therein. Depositing 826 the oxynitride layer may be performed, e.g., as described above with reference to FIG. 3 and step 300 illustrated therein. Patterning 828 the stack removal photoresist layer may be performed, e.g., as described above with reference to FIG. 4 and step 400 illustrated therein. Depositing 832 a high-k gate oxide layer as the capping oxide layer at the sub-90 nm regime may be performed, e.g., as described above with reference to FIG. 6 and step 600 illustrated therein.

Following the high-k capping oxide deposition 832, an embodiment of the simplified standard CMOS foundry process flow 810 with additional embedded SONOS NVM steps 820 then returns to the standard CMOS flow 810 again to deposit gate polysilicon (block 834), and perform LDD and/ or S-D extension (block 836). The gate oxide and gate polysilicon combine to form the control gate for the NMOS and PMOS transistors. Voltage bias may be applied to the transistor gates to turn the devices on and off. The LDD and/or S-Dextension is the doped silicon region that connects the MOS transistor highly doped source and drain regions to the active channel regions directly under the gates.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A method for integrating a silicon oxide nitride oxide silicon (SONOS) non-volatile memory (NVM) into a standard sub-90 nm complementary metal oxide semiconductor (CMOS) foundry process flow, comprising:
   performing standard CMOS foundry process flow, including:
      forming an alignment layer on a silicon substrate;
      forming twin-wells in the silicon substrate to form a plurality of devices on the silicon substrate; and
      isolating neighboring devices on the silicon substrate;
   patterning, on the silicon substrate, a memory window implant layer using a memory window implant photoresist and a memory window implant mask, forming a patterned SONOS memory cell region of an embedded SONOS NVM;
   patterning, on the silicon substrate, a stack removal photoresist layer defined by a stack removal photoresist mask, wherein the memory window implant mask is smaller than the stack removal photoresist mask; and
   depositing, on the silicon substrate, a high permittivity (high-k) gate oxide layer as a capping oxide layer.

2. The method of claim 1, wherein the patterning the memory window implant layer selectively sets a threshold voltage of a the embedded SONOS NVM.

3. The method of claim 1, wherein the stack removal photoresist layer is defined by the stack removal photoresist mask to allow a SONOS stack to be selectively removed from all regions of the silicon substrate except the patterned SONOS memory cell region.

4. The method of claim 1, wherein the high-k gate oxide layer forms a single dielectric layer for a low voltage CMOS device, and forms a dual dielectric layer with the high-k gate oxide as the top layer for a high voltage CMOS device, in addition to forming the capping oxide layer for the embedded SONOS NVM.

5. The method of claim 1, wherein the patterning the memory window implant layer includes patterning the memory window implant layer using memory window implant photoresist, forming the patterned SONOS memory cell region.

6. The method of claim 5, wherein the patterning the memory window implant layer further includes performing ion implantation through a scatter oxide layer to set a threshold voltage of a the embedded SONOS NVM.

7. The method of claim 6, wherein the patterning the memory window implant layer is performed with the memory window implant photoresist still on the silicon substrate and further includes wet etching the silicon substrate to remove the scatter oxide layer in a memory window opening defined by the memory window implant mask.

8. The method of claim 7, further comprising stripping the memory window implant photoresist and growing a tunnel oxide layer after patterning the memory window implant layer.

9. The method of claim 8, further comprising depositing an oxynitride layer after growing the tunnel oxide layer and prior to patterning the stack removal photoresist layer.

10. The method of claim 1, further comprising forming a high voltage gate oxide layer before depositing the high-k gate oxide layer, and wherein the high voltage gate oxide layer forms a thin oxidized layer on top of an oxynitride charge storage layer.

11. The method of claim 1, wherein the patterning the memory window implant layer includes patterning the memory window implant layer using the memory window implant photoresist, forming the patterned SONOS memory cell region, and wherein the patterning the stack removal photoresist layer includes patterning the SONOS stack using the stack removal photoresist mask.

12. The method of claim 11, wherein the patterning the stack removal photoresist layer further includes dry etching the silicon substrate to remove the oxynitride layer from the silicon substrate except over the patterned SONOS memory cell region.

13. The method of claim 12, wherein the patterning the stack removal photoresist layer further includes, with the stack removal photoresist mask still on the silicon substrate, removing the scatter oxide layer over CMOS gates using a wet etch.

14. The method of claim 13, wherein the patterning the stack removal photoresist layer further includes stripping the stack removal photoresist mask.

15. The method of claim 1, wherein the depositing the high-k gate oxide layer is performed using atomic layer deposition (ALD).

16. The method of claim 1, wherein the patterning the memory window implant layer further includes performing a short thermal oxide step to passivate surface states before depositing the high-k gate oxide layer.

17. The method of claim 1, wherein the high-k gate oxide layer is deposited only for the embedded SONOS NVM and a high voltage CMOS device in larger 65 nm or 90 nm geometries, and wherein a standard nitrided silicon dioxide is used for a low voltage CMOS device.

18. A method for forming a silicon oxide nitride oxide silicon (SONOS) non-volatile memory (NVM) as part of a standard sub-90 nm complementary metal oxide semiconductor (CMOS) foundry process flows, comprising:

patterning a memory window implant layer using a memory window implant photoresist and a memory window implant mask, forming a patterned SONOS memory cell region;

growing a tunnel oxide layer;

depositing an oxynitride layer;

patterning a stack removal photoresist layer defined by a stack removal photoresist mask, wherein the memory window implant mask is smaller than the stack removal photoresist mask; and depositing a high permittivity (high-k) gate oxide layer as a capping oxide layer.

\* \* \* \* \*

UNITED STATES PATENT AND TRADEMARK OFFICE
CERTIFICATE OF CORRECTION

PATENT NO.        : 8,409,950 B1
APPLICATION NO.   : 13/100986
DATED             : April 2, 2013
INVENTOR(S)       : Patrick Bruckner Shea et al.

Page 1 of 1

It is certified that error appears in the above-identified patent and that said Letters Patent is hereby corrected as shown below:

In the Claims

In col. 7, line 59, delete "voltage of a the" and insert therefor --voltage of the--.

In col. 8, line 12, delete "voltage of a the" and insert therefor --voltage of the--.

Signed and Sealed this
Twenty-fourth Day of September, 2013

Teresa Stanek Rea
*Deputy Director of the United States Patent and Trademark Office*